United States Patent
Chen et al.

(10) Patent No.: US 9,530,710 B2
(45) Date of Patent: Dec. 27, 2016

(54) PASSIVATION STRUCTURE OF FIN FIELD EFFECT TRANSISTOR

(71) Applicant: Taiwan Semiconductor Manufacturing Company, Ltd., Hsin-Chu (TW)

(72) Inventors: Yen-Yu Chen, Taipei (TW); Chi-Yuan Shih, Hsin-Chu (TW); Ling-Yen Yeh, Hsin-Chu (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/815,027

(22) Filed: Jul. 31, 2015

(65) Prior Publication Data

US 2015/0340302 A1 Nov. 26, 2015

Related U.S. Application Data

(63) Continuation of application No. 14/047,804, filed on Oct. 7, 2013, now Pat. No. 9,142,474.

(51) Int. Cl.
*H01L 21/02* (2006.01)
*H01L 23/31* (2006.01)
(Continued)

(52) U.S. Cl.
CPC ..... *H01L 23/3171* (2013.01); *H01L 21/02233* (2013.01); *H01L 21/02247* (2013.01);
(Continued)

(58) Field of Classification Search
CPC .......... H01L 21/845; H01L 27/10802; H01L 29/42392; H01L 27/10897; H01L 29/66787; H01L 29/785; H01L 29/78687; H01L 29/66795; H01L 29/66545; H01L 29/7848; H01L 29/41791; H01L 29/7851
See application file for complete search history.

(56) References Cited

U.S. PATENT DOCUMENTS 6,475,869 B1 11/2002 Yu
8,883,585 B1 11/2014 Fumitake
(Continued)

FOREIGN PATENT DOCUMENTS

KR 20060062048 A 6/2006
KR 20070000758 A 1/2007

OTHER PUBLICATIONS

Shiozawa, K., et al., "Remarkable Effects of Introduction of SiON Materials into Shallow Trench Isolation Fabrication Process on Metal-Oxide-Semiconductor Field-Effect Transistors," Jpn. J. Appl. Phys., vol. 40, Feb. 2001, pp. 462-466.

*Primary Examiner* — Thanh Y Tran
(74) *Attorney, Agent, or Firm* — Slater Matsil, LLP

(57) ABSTRACT

A FinFET comprises a substrate comprising a major surface; a fin structure protruding from the major surface comprising a lower fin portion comprising a first semiconductor material having a first lattice constant; an upper fin portion comprising a second semiconductor material having a second lattice constant greater than the first lattice constant; a middle fin portion comprising a third semiconductor material having a third lattice constant between the first lattice constant and the second lattice constant; and a passivation structure surrounding the fin structure comprising a lower passivation portion surrounding the lower fin portion comprising a first oxynitride of the first semiconductor material; an upper passivation portion surrounding the upper fin portion comprising a second oxynitride of the second semiconductor material; and a middle passivation portion surrounding the middle fin portion comprising a third oxynitride of the third semiconductor material.

20 Claims, 5 Drawing Sheets

(51) Int. Cl.
  *H01L 29/78*    (2006.01)
  *H01L 29/66*    (2006.01)
  *H01L 29/165*   (2006.01)
  *H01L 23/29*    (2006.01)

(52) U.S. Cl.
  CPC ...... *H01L 21/02318* (2013.01); *H01L 23/291* (2013.01); *H01L 23/3192* (2013.01); *H01L 29/165* (2013.01); *H01L 29/66795* (2013.01); *H01L 29/785* (2013.01); *H01L 29/7851* (2013.01); *H01L 21/02252* (2013.01); *H01L 21/02255* (2013.01); *H01L 2924/0002* (2013.01)

(56) References Cited

U.S. PATENT DOCUMENTS

| | | |
|---|---|---|
| 8,889,500 B1 | 11/2014 | Kamineni et al. |
| 8,952,420 B1 | 2/2015 | Loubet et al. |
| 2003/0173641 A1 | 9/2003 | Ohta et al. |
| 2005/0145932 A1 | 7/2005 | Park et al. |
| 2005/0158934 A1 | 7/2005 | Yun et al. |
| 2005/0173768 A1 | 8/2005 | Lee et al. |
| 2006/0118876 A1 | 6/2006 | Lee et al. |
| 2006/0189058 A1 | 8/2006 | Lee et al. |
| 2007/0048934 A1 | 3/2007 | Kim et al. |
| 2007/0158764 A1 | 7/2007 | Orlowski et al. |
| 2007/0167024 A1 | 7/2007 | Li et al. |
| 2008/0135888 A1 | 6/2008 | Lee et al. |
| 2008/0296648 A1 | 12/2008 | Zhu |
| 2010/0052043 A1 | 3/2010 | Lee |
| 2011/0073952 A1 | 3/2011 | Kwok et al. |
| 2011/0081764 A1 | 4/2011 | Maszara et al. |
| 2011/0084340 A1 | 4/2011 | Yuan et al. |
| 2011/0140229 A1 | 6/2011 | Rachmady et al. |
| 2011/0175149 A1 | 7/2011 | Kim et al. |
| 2011/0198700 A1 | 8/2011 | Park et al. |
| 2012/0074386 A1 | 3/2012 | Rachmady et al. |
| 2012/0168830 A1 | 7/2012 | Usuda et al. |
| 2013/0093026 A1 | 4/2013 | Wann et al. |
| 2013/0228830 A1 | 9/2013 | Lee et al. |
| 2013/0234203 A1 | 9/2013 | Tsai et al. |
| 2013/0256764 A1 | 10/2013 | Liaw |
| 2013/0277686 A1 | 10/2013 | Liu et al. |
| 2014/0027816 A1 | 1/2014 | Cea et al. |
| 2014/0042500 A1 | 2/2014 | Wann et al. |
| 2014/0138770 A1* | 5/2014 | van Dal ............ H01L 29/66431 257/347 |
| 2014/0197493 A1 | 7/2014 | Tsai et al. |
| 2014/0203370 A1 | 7/2014 | Maeda et al. |
| 2014/0225065 A1 | 8/2014 | Rachmady et al. |
| 2014/0239354 A1 | 8/2014 | Huang et al. |
| 2014/0246731 A1 | 9/2014 | Chen et al. |
| 2014/0256105 A1 | 9/2014 | Wann et al. |
| 2014/0273360 A1 | 9/2014 | Cheng et al. |
| 2014/0299934 A1 | 10/2014 | Kim et al. |
| 2014/0361336 A1 | 12/2014 | Chen et al. |
| 2014/0374827 A1 | 12/2014 | Suh et al. |
| 2014/0374838 A1 | 12/2014 | Chen et al. |
| 2014/0377922 A1 | 12/2014 | Fung |
| 2015/0028426 A1 | 1/2015 | Ching et al. |
| 2015/0054039 A1 | 2/2015 | Ching et al. |

* cited by examiner

PASSIVATION STRUCTURE OF FIN FIELD EFFECT TRANSISTOR

This application is a continuation application of, and claims priority to, U.S. patent application Ser. No. 14/047,804, entitled "Passivation Structure of fin Field Effect Transistor," filed on Oct. 7, 2013, which application is incorporated herein by reference

TECHNICAL FIELD

The disclosure relates to integrated circuit fabrication, and more particularly to a fin field effect transistor with a passivation structure.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides. In addition, strained materials in source/drain (S/D) portions of the FinFET utilizing selectively grown silicon germanium (SiGe) may be used to enhance carrier mobility.

However, there are challenges to implementation of such features and processes in complementary metal-oxide-semiconductor (CMOS) fabrication. For example, interface traps between fins and shallow-trench-isolation (STI) oxide cause high leakage current of the FinFET, thereby degrading the device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

Figure 1:
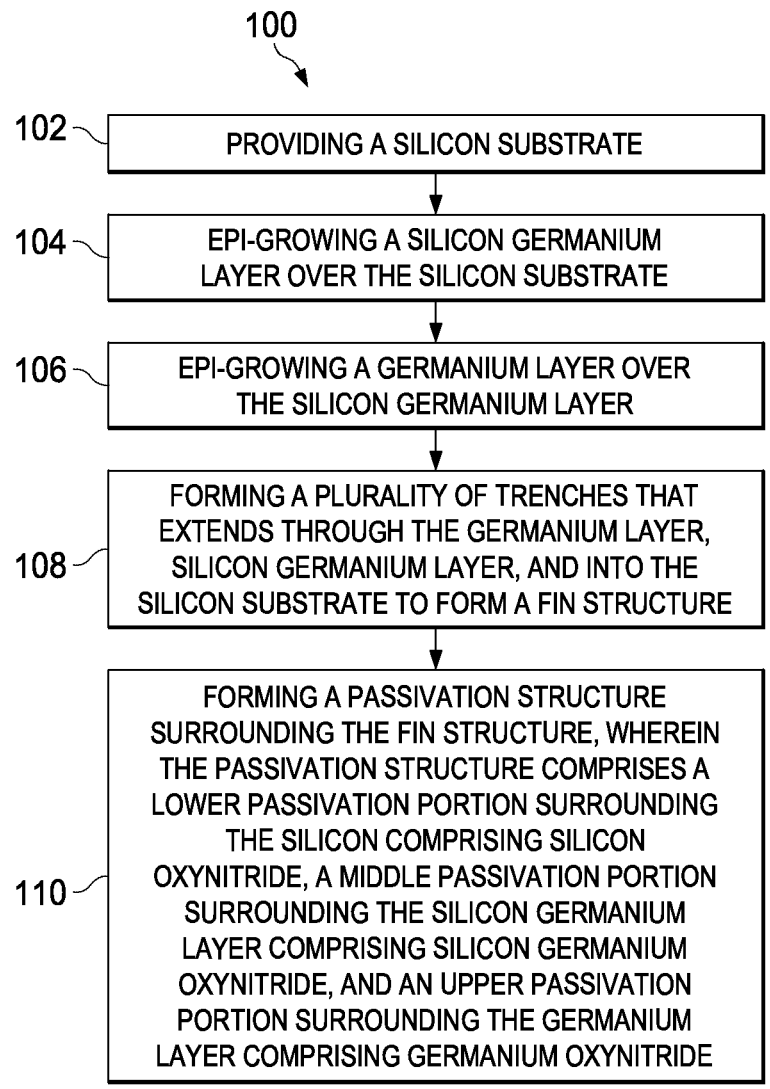
FIG. 1 is a flowchart illustrating a method of fabricating a FinFET according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flowchart of a method 100 of fabricating a fin field effect transistor (FinFET) according to various aspects of the present disclosure. The method 100 begins with step 102 in which a silicon substrate is provided. The method 100 continues with step 104 in which a silicon germanium layer is epi-grown over the silicon substrate. The method 100 continues with step 106 in which a germanium layer is epi-grown over the silicon germanium layer. The method 100 continues with step 108 in which a plurality of trenches is formed that extends through the germanium layer, silicon germanium layer, and into the silicon substrate to form a fin structure. The method 100 continues with step 110 in which a passivation structure surrounding the fin structure is formed, wherein the passivation structure comprises a lower passivation portion surrounding the silicon comprising silicon oxynitride, a middle passivation portion surrounding the silicon germanium layer comprising silicon germanium oxynitride, and an upper passivation portion surrounding the germanium layer comprising germanium oxynitride. The discussion that follows illustrates embodiments of FinFETs that can be fabricated according to the method 100 of FIG. 1.

Figure 2:
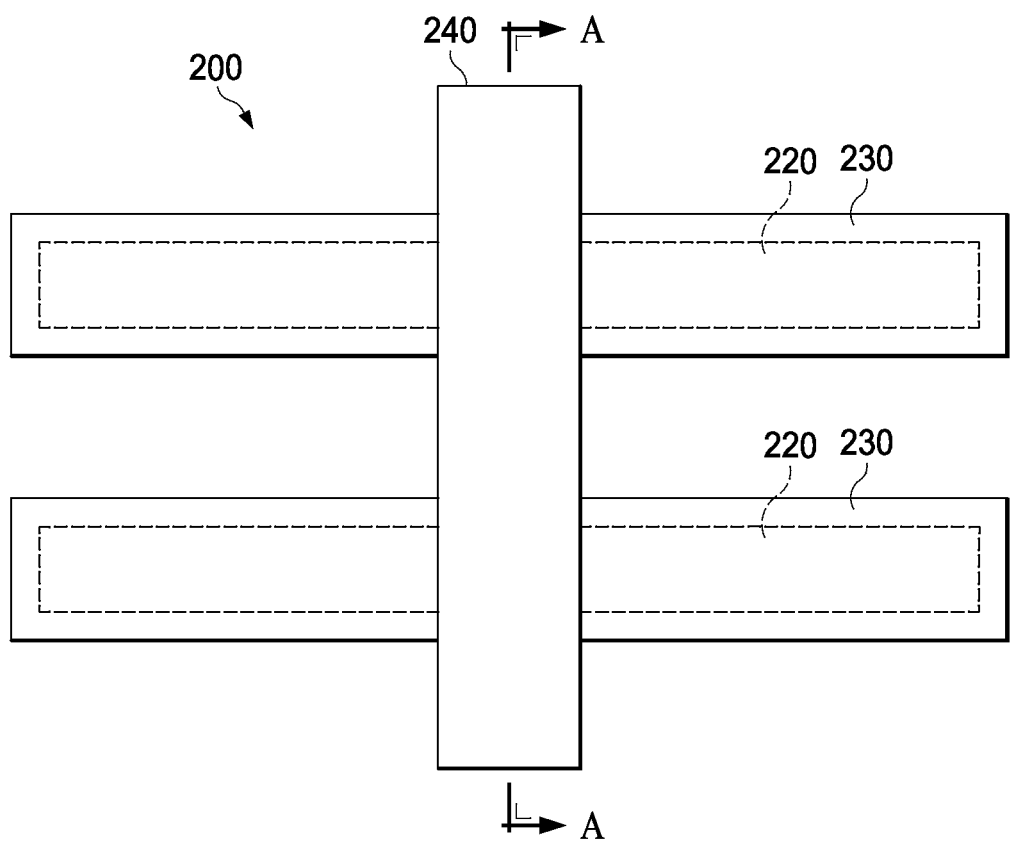
FIG. 2 shows a top view of a FinFET comprising a passivation structure according to various aspects of the present disclosure.

FIG. 2 shows a top view of a fin field effect transistor (FinFET) 200 comprising a passivation structure 230 according to various aspects of the present disclosure. FIGS. 3-9 are cross-sectional views of a FinFET 200 taken along the line a-a of FIG. 2 at various stages of fabrication according to various embodiment of the present disclosure. As employed in the present disclosure, the FinFET 200 refers to any fin-based, multi-gate transistor. Other transistor structures and analogous structures are within the contemplated scope of the disclosure. The FinFET 200 may be included in a microprocessor, memory cell, and/or other integrated circuit (IC).

It is noted that the method of FIG. 1 does not produce a completed FinFET 200. A completed FinFET 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 9 are simplified for a better understanding of the concepts of the present disclosure. For example, although the figures illustrate the FinFET 200, it is understood the IC may comprise a number of other devices comprising resistors, capacitors, inductors, fuses, etc.

FIG. 2 illustrates a FinFET 200 fabricated using the steps in FIG. 1. For illustration, the FinFET 200 comprises a fin structure 220 (dashed line), a passivation structure 230 surrounding the fin structure 220 and a gate structure 240 traversing over a channel portion of the fin structure 220. For illustration, the FinFET 200 comprises two fins. In some embodiments, the FinFET 200 may comprise less than or greater than two fins, for example, one fin or three fins.

Figure 3:
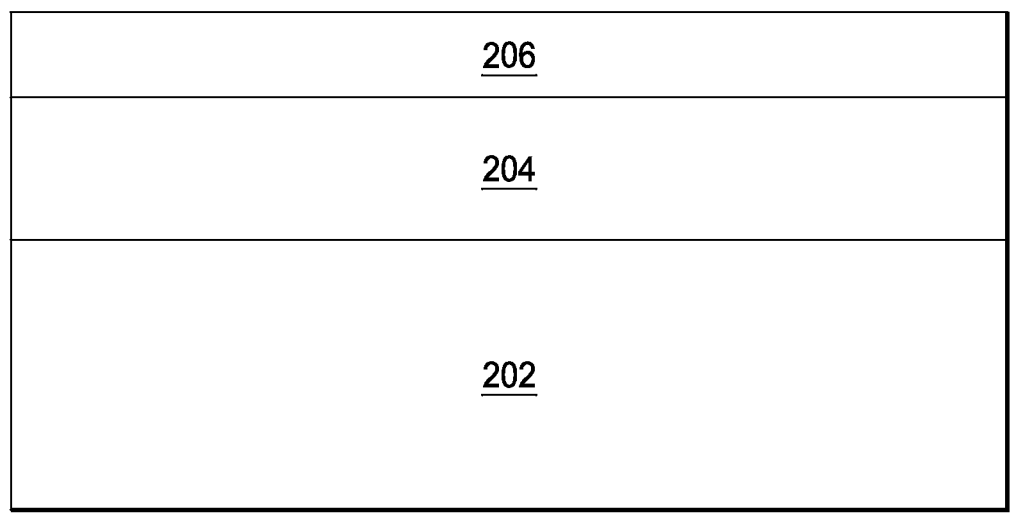
FIGS. 3-9 are cross-sectional views of a FinFET at various stages of fabrication according to various embodiment of the present disclosure.

Referring to FIG. 3 and step 102 in FIG. 1, a substrate 202 is provided, wherein the substrate 202 comprise a first semiconductor material having a first lattice constant and hence is also referred to as first semiconductor material 202 in the present disclosure. In one embodiment, the substrate 202 comprises a crystalline silicon substrate (e.g., wafer). In alternative embodiments, the substrate 202 comprises a silicon-on-insulator (SOI) structure. The substrate 202 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

Still referring to FIG. 3, the structure in FIG. 3 is produced by epi-growing a second semiconductor material 204 (such as silicon germanium layer 204) over the silicon substrate 202 (step 104 in FIG. 1), wherein the second semiconductor material 204 has a second lattice constant greater than the first lattice constant. In the depicted embodiment, the second semiconductor material 204 (such as silicon germanium layer 204) is selectively grown by a low-pressure chemical vapor deposition (LPCVD) process. In one embodiment, the LPCVD process is performed at a temperature of about 350° C. to about 800° C. and under a pressure of about 1 Torr to about 200 Torr, using $SiH_4$, $Si_2H_6$, $GeH_4$, $Ge_2H_6$, HCl, $B_2H_6$, and $H_2$ as reaction gases. In some embodiments, the silicon germanium layer 204 has a thickness ranging from about 10 nm to about 50 nm Still referring to FIG. 3, the structure in FIG. 3 is produced by epi-growing a third semiconductor material 206 (such as germanium layer 206) over the second semiconductor material 204 (step 106 in FIG. 1), wherein the third semiconductor material 206 has a third lattice constant greater than the second lattice constant. As such, the second lattice constant is between the first lattice constant and the third lattice constant. In the depicted embodiment, the third semiconductor material 206 (such as germanium layer 206) is selectively grown by an LPCVD process. In one embodiment, the LPCVD process is performed at a temperature of about 200° C. to about 700° C. and under a pressure of about 1 Torr to about 200 Torr, using $GeH_4$ or $Ge_2H_6$ as reaction gases. In some embodiments, the germanium layer 206 has a thickness ranging from about 10 nm to about 50 nm.

Figure 4:
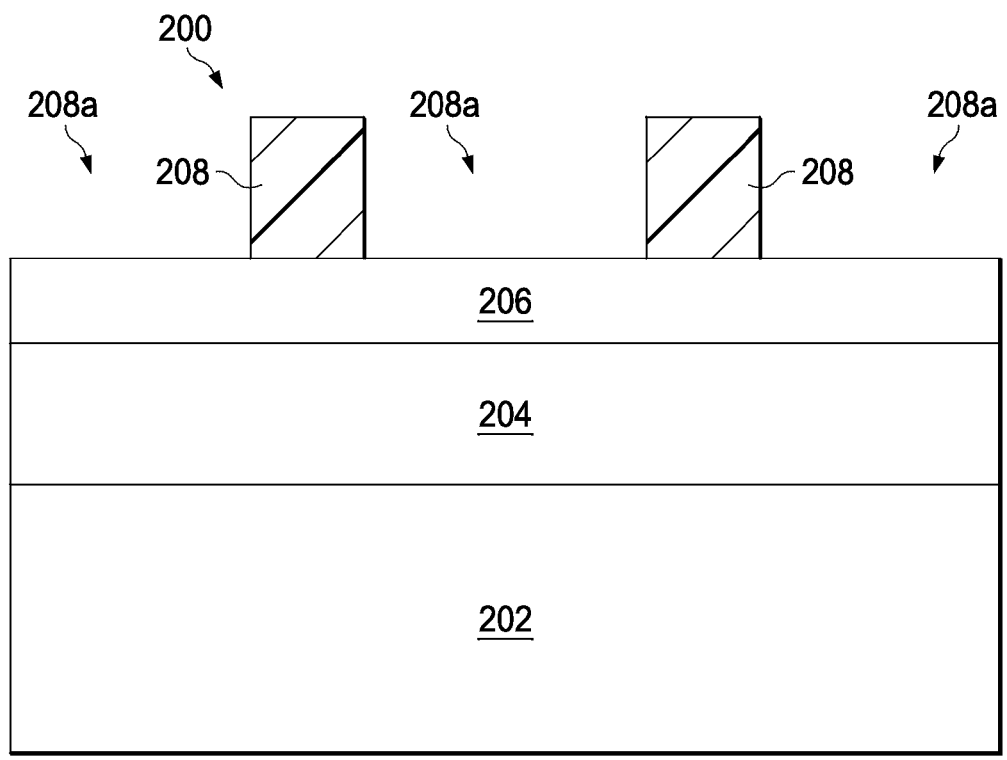
Figure 5:
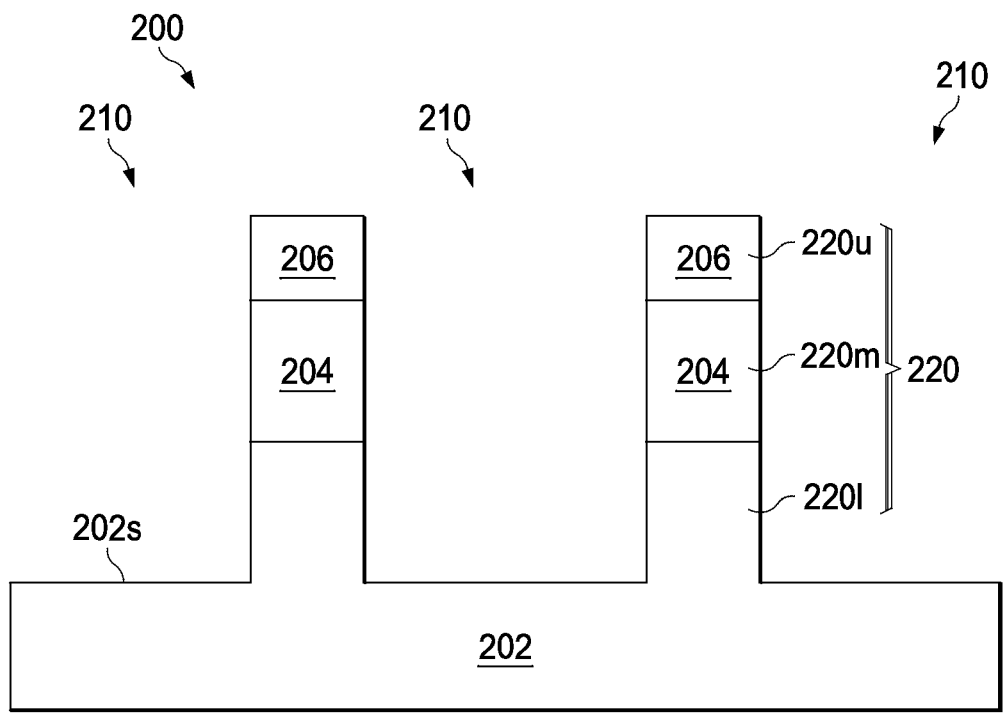

As depicted in FIGS. 4-5 and step 108 in FIG. 1, for forming a plurality of trenches (such as trenches 210 in FIG. 5) that extends through the germanium layer 206, silicon germanium layer 204, and into the silicon substrate 202 to form a fin structure (such as fin structure 220 in FIG. 5), the structure in FIG. 4 is produced by forming a photo-sensitive layer 208 on the germanium layer 206. The photo-sensitive layer 208 is then patterned, forming openings 208a in the photo-sensitive layer 208.

The exposed germanium layer 206 is then etched to form a plurality of trenches 210 with major surfaces 202s of the silicon substrate 202. In some embodiments, the plurality of trenches 210 extends through the germanium layer 206, silicon germanium layer 204, and into the silicon substrate 202. In some embodiments, the trenches 210 may be strips (viewed from in the top of the FinFET 200) parallel to each other, and closely spaced with respect to each other. In some embodiments, the trenches 210 may be continuous and surrounding the remaining germanium layer 206 and remaining silicon germanium layer 204. In some embodiments, the etching process may be performed using $CF_4$, $O_2$, HBr, He, $CH_3F$, and $SF_6$ as etching gas.

In the depicted embodiments, the remaining germanium layer 206, remaining silicon germanium layer 204, and remaining silicon substrate 202 between trenches 210 are combined and also hereinafter referred to as the fin structure 220 (shown in FIG. 5). Further, the remaining germanium layer 206 is hereinafter referred to as an upper fin portion 220u. The remaining silicon germanium layer 204 is hereinafter referred to as a middle fin portion 220m. The remaining silicon substrate 202 between trenches 210 is hereinafter referred to as a lower fin portion 220l.

As such, the fin structure 220 protruding from the major surface 220s comprises a lower fin portion 220l comprising a first semiconductor material 202 having a first lattice constant; an upper fin portion 220u comprising a second semiconductor material 206 having a second lattice constant greater than the first lattice constant; a middle fin portion 220m between the lower fin portion 220l and upper fin portion 220u, wherein the middle fin portion 220m comprises a third semiconductor material 204 having a third lattice constant between the first lattice constant and the second lattice constant.

In the depicted embodiment, the fin structure 220 protruding from the substrate major surface 202s comprises two fins. The photo-sensitive layer 208 is then removed. Next, a cleaning may be performed to remove a native oxide of the silicon substrate 202. The cleaning may be performed using diluted hydrofluoric (DHF) acid.

The process steps up to this point have provided the substrate 202 having the trenches 210 surrounding the fin structure 220. Conventionally, by introducing a dielectric material such as shallow-trench-isolation (STI) oxide in the trenches 210, each fin of the fin structure 220 is isolated from neighboring fins. However, the step of forming the STI oxide may create interface traps between the fin and STI oxide if there is no suitable buffer layer. The generated interface traps may provide a carrier transportation path between the fin and STI oxide and cause high leakage current of the FinFET, thereby degrading the device performance.

Accordingly, the processing discussed below with reference to FIG. 6 may form a passivation structure surrounding the fin structure 220 to impede generation of the interface traps between the fin and STI oxide. Problems associated with high leakage current due to high interface traps may be reduced and/or avoided. Thus, Applicant's method may achieve the desired device performance characteristics, such as low leakage.

Figure 6:
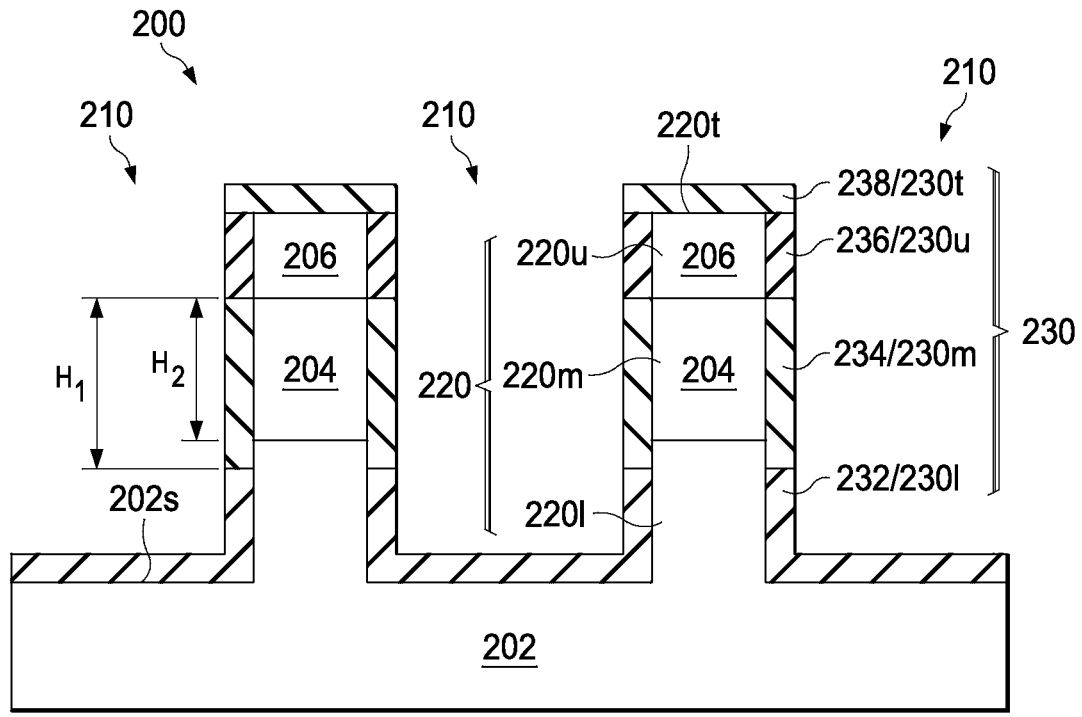

As depicted in FIG. 6 and step 110 in FIG. 1, for fabricating a passivation structure surrounding the fin structure 220 to enhance device performance, the structure in FIG. 6 is produced by forming a passivation structure 230 surrounding the fin structure 220, wherein the passivation structure 230 comprises a lower passivation portion 230l surrounding the first semiconductor material 202 (such as the silicon 202) comprising a first oxynitride 232 (such as silicon oxynitride 232), a middle passivation portion 230m surrounding the second semiconductor material 204 (such as the silicon germanium layer 204) comprising a second oxynitride 234 (such as silicon germanium oxynitride 234), and an upper passivation portion 230u surrounding the third semiconductor material 206 (such as the germanium layer 206) comprising a third oxynitride 236 (such as germanium oxynitride 236).

As such, the passivation structure 230 surrounding the fin structure 220 comprises the lower passivation portion 230l surrounding the lower fin portion 220l comprising the first oxynitride 232 of the first semiconductor material 202; the upper passivation portion 230u surrounding the upper fin portion 220u comprising the third oxynitride 236 of the third semiconductor material 206; and the middle passivation portion 230m between the lower passivation portion 230l and upper passivation portion 230u, wherein the middle passivation portion 230m surrounding the middle fin portion 220m comprises a second oxynitride 234 of the second semiconductor material 204.

Thus, the passivation structure 230 may act as a buffer layer of the fin 220 and STI oxide (such as STI oxide 216 in FIG. 8) to impede generation of the interface traps. Problems associated with high leakage current due to high interface traps may be reduced and/or avoided. Applicant's method may achieve the desired device performance characteristics, such as low leakage.

In the depicted embodiment, the step of forming the passivation structure 230 surrounding the fin structure 220 is performed by an oxidation process, followed by a nitridation process. In some embodiments, the oxidation process comprises a rapid thermal oxidation (RTO) process, chemical oxidation process, in-situ stream generation (ISSG) process, or enhanced in-situ stream generation (EISSG) process. In some embodiments, the RTO process is performed at a temperature of about 400° C. to about 700° C., using $O_2$ and $O_3$ as reaction gases.

In some embodiments, the nitridation process comprises a rapid thermal nitridation (RTN) process or decoupled plasma nitridation (DPN) process. In some embodiments, the RTN process is performed at a temperature of about 400° C. to about 800° C., using $NH_3$ as reaction gas. In some embodiments, the DPN process is performed under a power of about 300 Watts to about 2250 Watts, using $N_2$ and $NH_3$ as reaction gases. In some embodiments, a post nitridation anneal (PNA) process is performed after the DPN process. In some embodiments, the PNA is performed at a temperature of about 400° C. to about 700° C., using $N_2$ as anneal gas.

In some embodiments, the passivation structure 230 further comprises a top passivation portion 230t on an apex 220t of the upper fin portion 220u, wherein the top passivation portion 230t comprises a fourth oxynitride 238 (such as germanium oxynitride 238) of the third semiconductor material 206. Each N/O ratio of each oxynitride may be controlled through process condition adjustment, such as plasma power or temperature. In some embodiments, a ratio of a first N/O ratio of the fourth oxynitride 238 is equal to or greater than a second N/O ratio of the third oxynitride 236. In some embodiments, a ratio of the first N/O ratio to the second N/O ratio is from about 1 to about 1.3.

In some embodiments, some elements in the second semiconductor material 204 (such as germanium in the silicon germanium layer 204) may diffuse into the first semiconductor material 202 (such as the silicon 202) during the nitridation process at a temperature of about 400° C. to about 800° C. As such, the middle passivation portion 230m further extends into a portion surrounding the lower fin portion 220l. In some embodiments, a first height $H_1$ of the middle passivation portion 230m is equal to or greater than a second height $H_2$ of the middle fin portion 220m. In some embodiments, a ratio of the first height $H_1$ to the second height $H_2$ is from about 1 to about 1.2.

Figure 7:
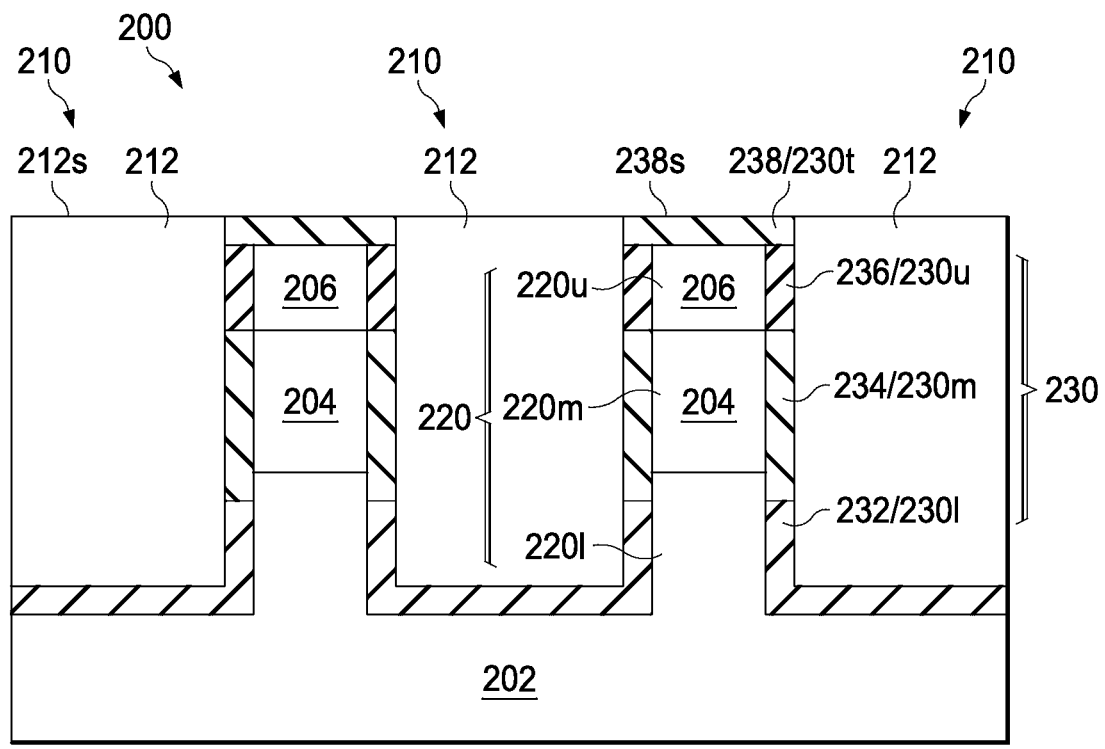

FIG. 7 depicts the resulting structure after filling the trenches 210 with a dielectric material 212. The dielectric material 212 may include silicon oxide, and hence is also referred to as STI oxide 212 in the present disclosure. In some embodiments, other dielectric materials, such as silicon nitride, silicon oxynitride, fluoride-doped silicate glass (FSG), or a low-K dielectric material, may also be used. In some embodiments, the STI oxide 212 may be formed using a high-density-plasma (HDP) CVD process, using silane ($SiH_4$) and oxygen ($O_2$) as reacting precursors. In other embodiment, the STI oxide 212 may be formed using a sub-atmospheric CVD (SACVD) process or high aspect-ratio process (HARP), wherein process gases may comprise tetraethylorthosilicate (TEOS) and ozone ($O_3$). In yet other embodiments, the STI oxide 212 may be formed using a spin-on-dielectric (SOD) process, such as hydrogen silsesquioxane (HSQ) or methyl silsesquioxane (MSQ). After forming the STI oxide 212, a planarization such as a CMP is performed, so that a top surface 212s of the STI oxide 212 is substantially level with a top surface 238s of the fourth oxynitride 238.

Figure 8:
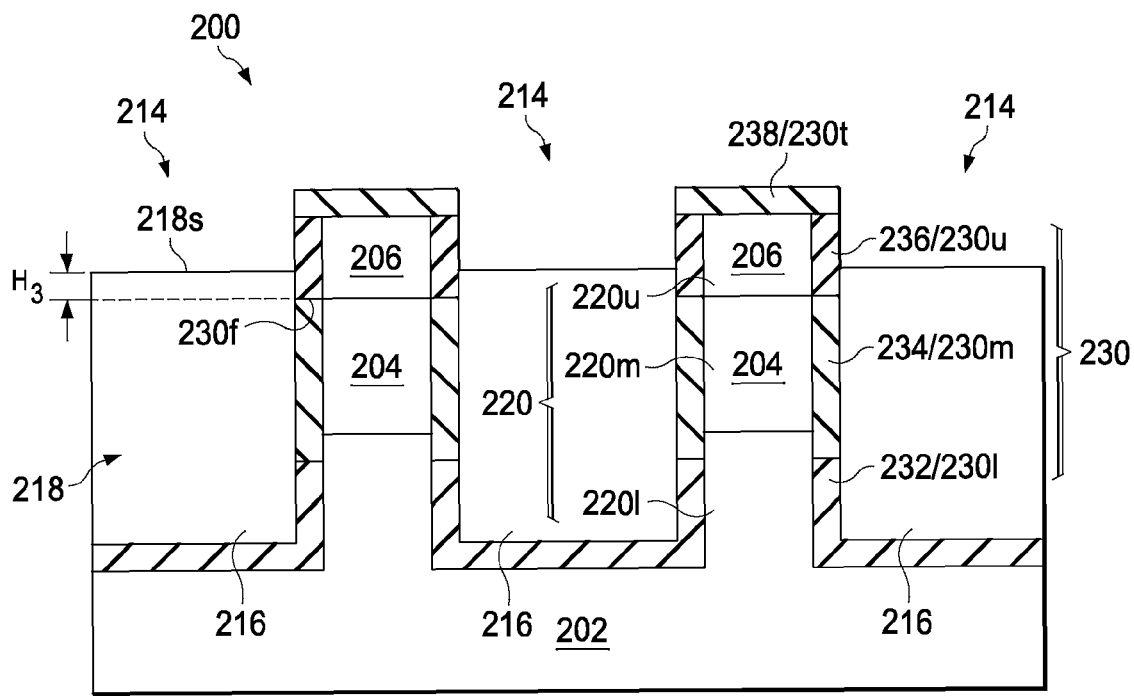
Figure 9:
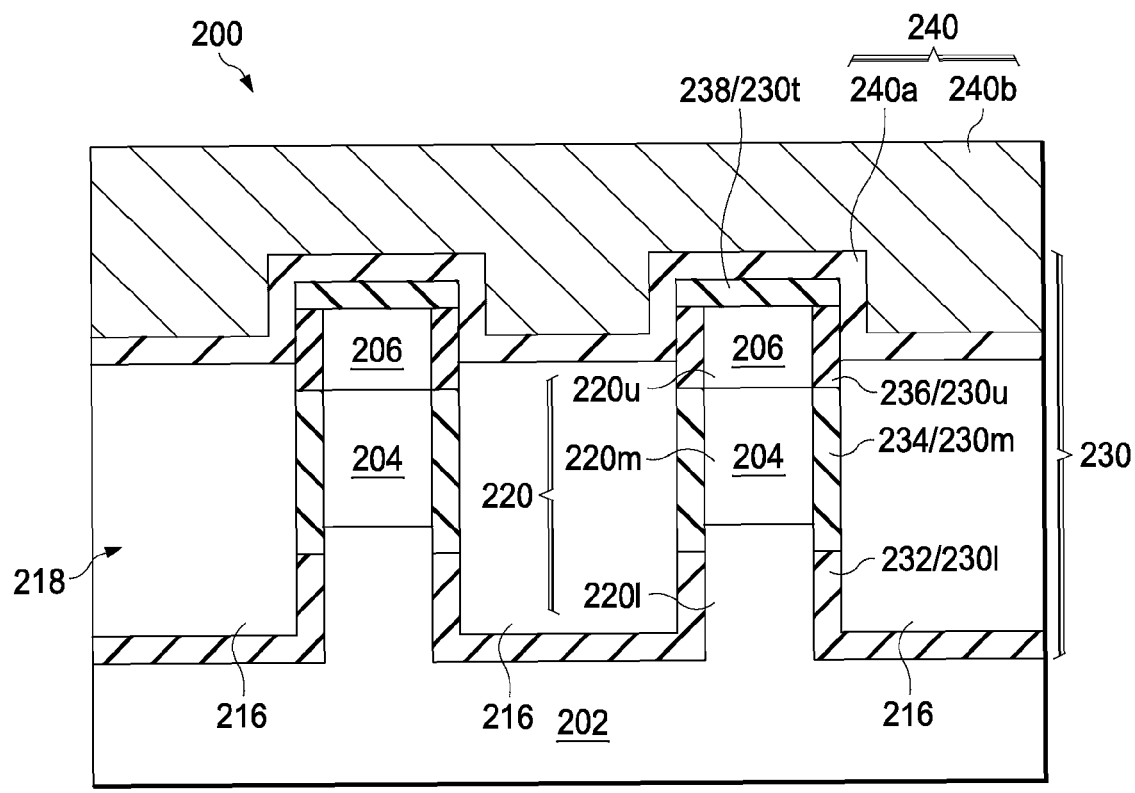

Next, the planarized STI oxide 212 are recessed by an etching step to expose the fourth oxynitride 238 and a portion of the third oxynitride 236, resulting in recesses 214 and a remaining STI oxide 216 (shown in FIG. 8). The remaining STI oxide 216 surrounding the passivation structure 230 is hereinafter referred to as an isolation structure 218, wherein a top surface 218s of the isolation structure 218 is higher than an interface 230f of the upper passivation portion 230u and middle passivation portion 230m. In some embodiments, the top surface 218s of the isolation structure 218 is lower than the interface 230f of the upper passivation portion 230u and middle passivation portion 230m (not shown). In some embodiments, a height difference $H_3$ between the top surface 218s and the interface 230f is from about −5 nm to about 20 nm In some embodiments, the etching step may be performed using a wet etching process, for example, by dipping the substrate 202 in hydrofluoric acid (HF). In some embodiments, the etching step may be performed using a vapor etching process, for example, the vapor etching process may be performed using HF as etching gas.

In the depicted embodiment, the exposed portion (i.e., the fourth oxynitride 238 and the portion of the third oxynitride 236) surrounds a portion of the upper fin portion 220u. The portion of the upper fin portion 220u comprises source/drain (S/D) portions and a channel portion between the S/D portions. In some embodiments, a gate structure 240 comprising a gate dielectric 240a and a gate electrode 240b traverses over channel portion of the fin structure 220 (shown in FIG. 9).

As such, using the passivation structure 230 surrounding the fin structure 220 to impede generation of the interface traps between the fin 220 and STI oxide 216, problems associated with high leakage current due to high interface traps may be reduced and/or avoided. Applicant's method may achieve the desired device performance characteristics, such as low leakage.

It is understood that the FinFET 200 may undergo further CMOS processes to form various features such as contacts/vias, interconnect metal layers, dielectric layers, passivation layers, etc.

In accordance with embodiments, a fin field effect transistor (FinFET) comprises a substrate comprising a major surface; a fin structure protruding from the major surface comprising a lower fin portion comprising a first semiconductor material having a first lattice constant; an upper fin portion comprising a second semiconductor material having a second lattice constant greater than the first lattice constant; a middle fin portion between the lower fin portion and upper fin portion, wherein the middle fin portion comprises a third semiconductor material having a third lattice constant between the first lattice constant and the second lattice constant; and a passivation structure surrounding the fin structure comprising a lower passivation portion surrounding the lower fin portion comprising a first oxynitride of the first semiconductor material; an upper passivation portion surrounding the upper fin portion comprising a second oxynitride of the second semiconductor material; a middle passivation portion between the lower passivation portion and upper passivation portion, wherein the middle passivation portion surrounding the middle fin portion comprises a third oxynitride of the third semiconductor material.

In accordance with another embodiments, a fin field effect transistor (FinFET) comprises a substrate comprising a major surface; a fin structure protruding from the major surface comprising a lower fin portion comprising a first semiconductor material having a first lattice constant; an upper fin portion comprising a second semiconductor material having a second lattice constant greater than the first lattice constant; a middle fin portion between the lower fin portion and upper fin portion, wherein the middle fin portion comprises a third semiconductor material having a third lattice constant between the first lattice constant and the second lattice constant; a passivation structure surrounding the fin structure comprising a lower passivation portion surrounding the lower fin portion comprising a first oxynitride of the first semiconductor material; an upper passivation portion surrounding the upper fin portion comprising a second oxynitride of the second semiconductor material; a middle passivation portion between the lower passivation portion and upper passivation portion, wherein the middle passivation portion surrounding the middle fin portion comprises a third oxynitride of the third semiconductor material; and an isolation structure surrounding the passivation structure, wherein a top surface of the isolation structure is higher than an interface of the upper passivation portion and middle passivation portion.

In accordance with another embodiments, a method of fabricating a fin field effect transistor comprises providing a silicon substrate; epi-growing a silicon germanium layer over the silicon substrate; epi-growing a germanium layer over the silicon germanium layer; forming a plurality of trenches that extends through the germanium layer, silicon germanium layer, and into the silicon substrate to form a fin structure; and forming a passivation structure surrounding the fin structure, wherein the passivation structure comprises a lower passivation portion surrounding the silicon comprising silicon oxynitride, a middle passivation portion surrounding the silicon germanium layer comprising silicon germanium oxynitride, and an upper passivation portion surrounding the germanium layer comprising germanium oxynitride.

In accordance with yet another embodiment, a method of fabricating a fin field effect transistor is provided. The method includes forming a first fin on a semiconductor substrate, the first fin including a first semiconductor material, a second semiconductor material over the first semiconductor material, and a third semiconductor material over the second semiconductor material, wherein the first semiconductor material has a first lattice constant, the second semiconductor material has a second lattice constant, the third semiconductor material has a third lattice constant, the first lattice constant being different than the second lattice constant, the second lattice constant being different than the third lattice constant. An oxidation process is performed along sidewalls of the first fin, and a nitridation process is performed along sidewalls of the first fin. The nitridation process forms a nitride layer along sidewalls of the first fin, such that the nitride layer has a first portion including elements of the first semiconductor material, a second portion including elements of the second semiconductor material, and a third portion including elements of the third semiconductor material.

In accordance with yet another embodiment, a method of fabricating a fin field effect transistor is provided. The method includes forming a first semiconductor layer over a semiconductor substrate, the first semiconductor layer having a different lattice constant than the semiconductor substrate, and forming a second semiconductor layer over the first semiconductor layer, the second semiconductor layer having a different lattice constant than the first semiconductor layer. A plurality of trenches is formed that extends through the first semiconductor layer, the second semiconductor layer, and into the semiconductor substrate to form a fin structure between adjacent trenches. A passivation layer is formed along sidewalls and a bottom of the trenches, the passivation layer comprising a nitride layer, and an isolation layer is formed over the nitride layer along opposing sides of the fin structure.

In accordance with yet another embodiment, a fin field effect transistor is provided. The fin field effect transistor includes a fin extending from a substrate, the fin having a first semiconductor material, a second semiconductor material over the first semiconductor material, and a third semiconductor material over the second semiconductor material, the first semiconductor material having a first lattice constant, the second semiconductor material having a second lattice constant, the third semiconductor material having a third lattice constant, the first lattice constant being different than the second lattice constant, the second lattice constant being different than the third lattice constant. A passivation layer is over the fin, the passivation layer comprising a first nitride along sidewalls of the first semiconductor material, a second nitride along sidewalls of the second semiconductor material, and a third nitride along sidewalls of the third semiconductor material.

While the disclosure has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a fin field effect transistor, the method comprising:
   forming a first fin on a semiconductor substrate, the first fin comprising a first semiconductor material, a second semiconductor material over the first semiconductor material, and a third semiconductor material over the second semiconductor material, the first semiconductor material having a first lattice constant, the second semiconductor material having a second lattice constant, the third semiconductor material having a third lattice constant, the first lattice constant being different than the second lattice constant, the second lattice constant being different than the third lattice constant;
   performing an oxidation process along sidewalls of the first fin; and
   performing a nitridation process along sidewalls of the first fin, the nitridation process forming a nitride layer along sidewalls of the first fin, the nitride layer having a first portion comprising elements of the first semiconductor material, a second portion comprising elements of the second semiconductor material, and a third portion comprising elements of the third semiconductor material.

2. The method of claim 1, wherein the performing the oxidation process comprises a rapid thermal oxidation process.

3. The method of claim 2, wherein the performing the nitridation process comprises a decoupled plasma nitridation process.

4. The method of claim 2, wherein the performing the nitridation process comprises a rapid thermal nitridation process.

5. The method of claim 4, wherein the rapid thermal nitridation process is performed at a temperature of about 400° C. to about 800° C.

6. The method of claim 1, further comprising performing a post-nitridation anneal process.

7. A method of fabricating a fin field effect transistor, the method comprising:
    forming a first semiconductor layer over a semiconductor substrate, the first semiconductor layer having a different lattice constant than the semiconductor substrate;
    forming a second semiconductor layer over the first semiconductor layer, the second semiconductor layer having a different lattice constant than the first semiconductor layer;
    forming a plurality of trenches that extends through the first semiconductor layer, the second semiconductor layer, and into the semiconductor substrate to form a fin structure between adjacent trenches;
    forming a passivation layer along sidewalls and a bottom of the trenches, the passivation layer comprising a nitride layer; and
    forming an isolation layer over the nitride layer along opposing sides of the fin structure.

8. The method of claim 7, wherein the forming the first semiconductor layer comprises epitaxially growing the first semiconductor layer on the semiconductor substrate, and wherein the forming the second semiconductor layer comprises epitaxially growing the second semiconductor layer on the first semiconductor layer.

9. The method of claim 7, wherein a lattice constant of the first semiconductor layer is greater than a lattice constant of the semiconductor substrate.

10. The method of claim 9, wherein a lattice constant of the second semiconductor layer is greater than the lattice constant of the first semiconductor layer.

11. The method of claim 7, wherein the nitride layer is an oxynitride layer.

12. The method of claim 7, wherein the forming the passivation layer comprises:
    performing an oxidation process on the fin structure; and
    performing a nitridation process on the fin structure.

13. The method of claim 12, wherein the oxidation process is performed prior to performing the nitridation process.

14. The method of claim 7, wherein the passivation layer extends over a top of the fin structure.

15. A fin field effect transistor (FinFET) comprising:
    a fin extending from a substrate, the fin having a first semiconductor material, a second semiconductor material over the first semiconductor material, and a third semiconductor material over the second semiconductor material, the first semiconductor material having a first lattice constant, the second semiconductor material having a second lattice constant, the third semiconductor material having a third lattice constant, the first lattice constant being different than the second lattice constant, the second lattice constant being different than the third lattice constant; and
    a passivation layer over the fin, the passivation layer comprising a first nitride along sidewalls of the first semiconductor material, a second nitride along sidewalls of the second semiconductor material, and a third nitride along sidewalls of the third semiconductor material.

16. The FinFET of claim 15, wherein the first nitride comprises a first oxynitride, the second nitride comprises a second oxynitride, and the third nitride comprises a third oxynitride.

17. The FinFET of claim 16, wherein the passivation layer comprises a fourth oxynitride extending over an upper surface of the fin, a first N/O ratio of the fourth oxynitride is equal to or greater than a second N/O ratio of the third oxynitride.

18. The FinFET of claim 17, wherein a ratio of the first N/O ratio to the second N/O ratio is from about 1 to about 1.3.

19. The FinFET of claim 15, further comprising an isolation layer over the passivation layer, the isolation layer extending above an interface between the second semiconductor material and the third semiconductor material.

20. The FinFET of claim 19, a gate dielectric over the passivation layer and the isolation layer.

* * * * *